United States Patent
Yagi

(10) Patent No.: US 7,957,446 B2
(45) Date of Patent: Jun. 7, 2011

(54) SEMICONDUCTOR LASER AND METHOD OF MAKING SEMICONDUCTOR LASER

(75) Inventor: Hideki Yagi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 84 days.

(21) Appl. No.: 12/464,262

(22) Filed: May 12, 2009

(65) Prior Publication Data

US 2010/0034229 A1 Feb. 11, 2010

(30) Foreign Application Priority Data

Aug. 11, 2008 (JP) .................. 2008-207041

(51) Int. Cl.
*H01S 5/00* (2006.01)
(52) U.S. Cl. .............. 372/50.11; 372/45.01; 372/99
(58) Field of Classification Search ............ 372/50.11, 372/99
See application file for complete search history.

(56) References Cited

U.S. PATENT DOCUMENTS

2003/0063647 A1* 4/2003 Yoshida et al. ............. 372/50
2007/0253456 A1* 11/2007 Yagi ...................... 372/45.012

FOREIGN PATENT DOCUMENTS

JP 63-255985 10/1988

OTHER PUBLICATIONS

K. Shinoda et al., "Highly reliable operation of InGaAlAs/InGaAsP intergrated lasers", the 19th international conference on Indium Phospide and related materials (IPRM 2007), TuB2-3,39, May 15, 2007.

* cited by examiner

*Primary Examiner* — Tod T Van Roy
(74) *Attorney, Agent, or Firm* — Smith, Gambrell & Russell, LLP

(57) ABSTRACT

A semiconductor laser includes a first optical confinement layer, a plurality of first quantum wires and buried semiconductor regions disposed on a first area, a plurality of second quantum wires and buried semiconductor regions disposed on a second area, an active layer disposed on a third area, and a second optical confinement layer. The plurality of first quantum wires and the buried semiconductor regions constitute a first distributed Bragg reflector, and the plurality of second quantum wires and the buried semiconductor regions constitute a second distributed Bragg reflector. The third area is disposed between the first area and the second area. The buried semiconductor regions have a refractive index different from the average refractive index of the first quantum wires and the average refractive index of the second quantum wires. These distributed Bragg reflectors form a DBR laser having a cavity length defined by the length of the active layer.

9 Claims, 9 Drawing Sheets

SEMICONDUCTOR LASER AND METHOD OF MAKING SEMICONDUCTOR LASER

BACKGROUND OF THE INVENTION

1. Field of the Invention

The present invention relates to a semiconductor laser and a method of making a semiconductor laser.

2. Description of the Related Art

A distributed Bragg reflector laser (DBR laser) includes an active layer region and distributed Bragg reflector mirrors (DBR mirrors) provided at both sides of the active layer region. In general, in order to reduce the loss of the DBR mirrors, the energy gap (Eg) of a material constituting the DBR mirrors is set so as to be larger than the Eg of the active layer. Reference 1 (K. Shinoda et al.: The 19th International Conference on Indium Phosphide and Related materials (IPRM 2007), TuB2-3, 39, 15 May 2007) describes a short-cavity DBR laser. This DBR laser includes an active layer region having a multi-quantum well structure composed of InGaAlAs and DBR mirrors in which a diffraction grating is formed on an optical waveguide layer composed of InGaAsP. A butt joint structure is used in order to optically couple the active layer region to the optical waveguide layer including the grating. In the formation of the butt joint structure, a part of an InGaAlAs semiconductor layer grown on the semiconductor substrate is removed by etching, and an InGaAsP semiconductor layer is then regrown. The InGaAsP semiconductor layer constituting the DBR mirrors is composed of a material having a band-gap energy larger than the band-gap energy of the InGaAlAs semiconductor layer constituting the active layer. In addition, a high-reflection (HR) coating film composed of a dielectric film is provided on a back facet which is opposite to a front facet from which a laser beam is emitted.

Japanese Unexamined Patent Application Publication No. 63-255985 discloses a DBR laser. This semiconductor laser is configured so that the band-gap energy of an active layer is controlled to be relatively smaller than the band-gap energy of an optical waveguide region including a diffraction grating by adding an impurity to an active region.

SUMMARY OF THE INVENTION

The semiconductor laser described in Ref. 1 includes a multi-quantum well structure, an optical waveguide layer formed by a process different from a process for forming the multi-quantum well structure, a diffraction grating formed on the optical waveguide layer, and an HR coating film composed of a dielectric film and provided on a back facet of the semiconductor laser. Accordingly, this semiconductor laser has a complex structure. In addition, the multi-quantum well structure and the optical waveguide layer are formed so as to have a butt joint structure. Furthermore, after these semiconductor layers are regrown, the dielectric film is separately formed on the back facet of the semiconductor laser. Thus, the preparation process is complicated. In the semiconductor laser described in Japanese Unexamined Patent Application Publication No. 63-255985, an impurity is partly added to an active region. Accordingly, the preparation process of this semiconductor laser is complicated. Furthermore, since the impurity is added to an active layer, the optical loss of the active layer increases.

The present invention has been made in view of the above problems, and it is an object of the present invention to provide a semiconductor laser not having a butt joint structure but including a laser cavity having a semiconductor structure and a method of making the semiconductor laser.

The semiconductor laser according to the present invention includes a first optical confinement layer that is disposed on a cladding region and that has a main surface including a first area, a second area, and a third area; a plurality of first quantum wires arranged on the first area along a predetermined axis; a plurality of second quantum wires arranged on the second area along the predetermined axis; buried semiconductor regions disposed between side faces of the first quantum wires and between side faces of the second quantum wires; an active layer disposed on the third area and extending from an end of the third area to another end of the third area along the predetermined axis; a first distributed Bragg reflector disposed on the first area and including the plurality of first quantum wires and the buried semiconductor regions disposed between the side faces of the first quantum wires; a second distributed Bragg reflector disposed on the second area and including the plurality of second quantum wires and the buried semiconductor regions disposed between the side faces of the second quantum wires; and a second optical confinement layer disposed on the first distributed Bragg reflector, the second distributed Bragg reflector, and the active layer. In the semiconductor laser, the first area, the second area, and the third area are arranged along the predetermined axis, and the third area is disposed between the first area and the second area. Furthermore, the buried semiconductor regions have a refractive index different from an average refractive index of the first quantum wires and an average refractive index of the second quantum wires.

In this semiconductor laser, the first quantum wires and the buried semiconductor regions having a refractive index different from the refractive index of the first quantum wires are alternately arranged on the first area to constitute the first distributed Bragg reflector. Furthermore, the second quantum wires and the buried semiconductor regions having a refractive index different from the refractive index of the second quantum wires are alternately arranged on the second area to constitute the second distributed Bragg reflector. These distributed Bragg reflectors and the active layer constitute a laser cavity. Accordingly, the semiconductor laser of the present invention can realize a laser cavity without having a butt joint structure. Since the laser cavity does not include the butt joint structure, optical coupling loss due to the butt joint structure can be decreased.

In the semiconductor laser according to the present invention, the reflectivity of the first distributed Bragg reflector is preferably higher than the reflectivity of the second distributed Bragg reflector, and a reflection bandwidth of the first distributed Bragg reflector is preferably larger than a reflection bandwidth of the second distributed Bragg reflector.

This semiconductor laser is configured so that the reflectivity of the first distributed Bragg reflector is higher than the reflectivity of the second distributed Bragg reflector, and thus the first distributed Bragg reflector functions as a reflector having a high reflectivity. As a result, a higher optical output can be obtained from a facet at the side at which the second distributed Bragg reflector is provided. On the other hand, the semiconductor laser is configured so that the bandwidth of the stop-band (reflection bandwidth) of the first distributed Bragg reflector is larger than the bandwidth of the stop-band (reflection bandwidth) of the second distributed Bragg reflector. A plurality of longitudinal modes are included in the stop-band of the first distributed Bragg reflector, and threshold gains of these longitudinal modes are decreased. Herein, the term "threshold gain of a longitudinal mode" means a laser gain required for laser oscillation in the mode. Among the longitudinal modes in which the threshold gain is decreased, the threshold gain of a longitudinal mode included also in the stop-band of the second distributed Bragg reflector is further decreased. In general, when a plurality of longitudinal modes are present, the longitudinal mode having the lowest threshold gain selectively oscillates. Therefore, when the semiconductor laser is configured so that the bandwidth of the stop-band (reflection bandwidth) of the first distributed Bragg reflector is larger than the bandwidth of the stop-band (reflection bandwidth) of the second distributed Bragg reflector, a longitudinal mode included also in the stop-band of this second distributed Bragg reflector is selected and emitted as a single oscillation mode. Accordingly, the second distributed Bragg reflector functions as a wavelength selective filter, and thus light emitted from this semiconductor laser is in a single longitudinal mode.

In the semiconductor laser according to the present invention, a width of each of the first quantum wires in the direction of the predetermined axis may be larger than a width of each of the second quantum wires in the direction of the predetermined axis, and a length of the first distributed Bragg reflector in the direction of the predetermined axis may be longer than a length of the second distributed Bragg reflector in the direction of the predetermined axis.

In this semiconductor laser, since the width of each of the first quantum wires in the direction of the predetermined axis is larger than the width of each of the second quantum wires in the direction of the predetermined axis, the coupling coefficient of the first quantum wires is larger than the coupling coefficient of the second quantum wires. In addition, since the product of the length of a distributed Bragg reflector and the coupling coefficient contributes to the reflectivity and the bandwidth of the stop-band, the reflectivity of the first distributed Bragg reflector is higher than the reflectivity of the second distributed Bragg reflector. Accordingly, the first distributed Bragg reflector functions as a reflector having a high reflectivity, and a higher optical output can be obtained from a front facet of the second distributed Bragg reflector. Furthermore, the bandwidth of the stop-band (reflection bandwidth) of the first distributed Bragg reflector is larger than the bandwidth of the stop-band (reflection bandwidth) of the second distributed Bragg reflector. Accordingly, in this semiconductor laser, the second distributed Bragg reflector functions as a wavelength selective filter, and thus light emitted in a single longitudinal mode can be easily obtained.

In the semiconductor laser according to the present invention, preferably, the width of each of the first quantum wires in the direction of the predetermined axis and the width of each of the second quantum wires in the direction of the predetermined axis are each 50 nm or less and 20 nm or more.

In this semiconductor laser, since the width of each of the first quantum wires and the width of each of the second quantum wires are each 50 nm or less, the absorption edge wavelength can be shortened by an effective quantum effect. In addition, since the width of each of the first quantum wires and the width of each of the second quantum wires are each 20 nm or more, a predetermined large coupling coefficient ($\kappa$) of a diffraction grating can be obtained. Consequently, a distributed Bragg reflector having a predetermined reflectivity can be obtained.

In the semiconductor laser according to the present invention, each of the first quantum wires may include first well layers and first barrier layers that are alternately stacked, each of the second quantum wires may include second well layers and second barrier layers that are alternately stacked, the active layer may include third well layers and third barrier layers that are alternately stacked, the first well layers, the second well layers, and the third well layers may be composed of the same material, and the first barrier layers, the second barrier layers, and the third barrier layers may be composed of the same material.

According to this semiconductor laser, the first quantum wires, the second quantum wires, and the active layer include well layers composed of the same material and barrier layers composed of the same material. Therefore, the first quantum wires, the second quantum wires, and the active layer include the same semiconductor structure. The absorption edge wavelength of the first and second first quantum wires is shorter than the absorption edge wavelength of the active layer because the absorption edge wavelength of the quantum wire is shortened by the quantum effect. Thus, the first and second distributed Bragg reflectors function as optical waveguides with a low loss.

In the semiconductor laser according to the present invention, a length of the active layer in the direction of the predetermined axis is preferably 50 µm or more and 100 µm or less.

The length of the active layer in the direction of the predetermined axis corresponds to a cavity length of a laser cavity of this semiconductor laser. Since the cavity length is 100 µm or less, a longitudinal mode interval sufficient for realizing a single longitudinal mode using a selective reflection of the second distributed Bragg reflector can be obtained. In addition, since the cavity length is 50 µm or more, a sufficient gain can be obtained.

The semiconductor laser according to the present invention may further include an overflow prevention layer disposed between the active layer and the second optical confinement layer. In this case, the cladding region may be composed of an n-type semiconductor, the overflow prevention layer may be composed of a semiconductor material containing aluminum and indium as Group III elements and arsenic as a Group V element, the second optical confinement layer may be composed of a p-type GaInAsP semiconductor, and the band-gap energy of the overflow prevention layer may be larger than the band-gap energy of the second optical confinement layer and may be larger than the maximum band-gap energy of semiconductor layers in the active layer.

According to this semiconductor laser, a valence band offset between the overflow prevention layer and the second optical confinement layer can be small, and thus the overflow prevention layer does not function as a substantial barrier for holes moving toward the active layer. Therefore, a semiconductor laser having satisfactory characteristics can be obtained. On the other hand, at the conduction band side, the overflow prevention layer functions as a potential barrier for electrons moving from the active layer because of a difference in the magnitude of the band-gap energy. Accordingly, overflow of electrons from the active layer can be suppressed, and thus a semiconductor laser having satisfactory temperature characteristics can be obtained.

The semiconductor laser according to the present invention may further include a gap region disposed between the active layer and the second distributed Bragg reflector and composed of the same material as the buried semiconductor regions. In this case, a width of the gap region in the direction of the predetermined axis may be larger than an interval between the second quantum wires.

The semiconductor laser according to the present invention may further include an electrode disposed on the active layer. According to this semiconductor laser, carriers can be injected into the active layer.

A method of making a semiconductor laser according to the present invention includes the steps of growing a first optical confinement layer on a cladding region; growing a semiconductor layer for constituting a multi-quantum well on the first optical confinement layer; forming a mask on the semiconductor layer, the mask having a first pattern for forming a plurality of first quantum wires arranged in a direction of a predetermined axis, a second pattern for forming a plurality of second quantum wires arranged in the direction of the predetermined axis, and a third pattern for forming an active layer; etching the semiconductor layer using the mask to form the active layer, the first quantum wires, and the second quantum wires; and growing buried semiconductor regions between side faces of the first quantum wires and between side faces of the second quantum wires to bury the first quantum wires and the second first quantum wires, wherein the first pattern, the second pattern, and the third pattern are arranged in the direction of the predetermined axis, and the third pattern is provided between the first pattern and the second pattern.

In the method of the present invention, the plurality of first quantum wires and the buried semiconductor regions between the quantum wires are alternately arranged, thus forming a distributed Bragg reflector. Similarly, the plurality of second quantum wires and the buried semiconductor regions between the quantum wires are alternately arranged, thus forming a distributed Bragg reflector. Furthermore, the active layer is formed between the distributed Bragg reflector formed by the first quantum wires and the distributed Bragg reflector formed by the second quantum wires, and thus a DBR laser is formed. In forming this DBR laser, a semiconductor for constituting a multi-quantum well is etched using the mask having the first pattern to the third pattern. Therefore, the active layer, the first quantum wires, and the second quantum wires are produced by the same process without separately performing preparation processes.

In the method of making a semiconductor laser according to the present invention, a width of each of the first quantum wires in the direction of the predetermined axis may be larger than a width of each of the second quantum wires in the direction of the predetermined axis, and a length of the arrangement of the first quantum wires in the direction of the predetermined axis may be longer than a length of the arrangement of the second quantum wires in the direction of the predetermined axis.

In the method of the present invention, an arrangement of the plurality of first quantum wires and an arrangement of the plurality of second quantum wires are formed at both sides of the active layer along a predetermined axis. Each of the arrangements of the quantum wires functions as a distributed Bragg reflector. The length of the arrangement of the quantum wires in the direction of the predetermined axis corresponds to the length of the distributed Bragg reflector. The width of each of the first quantum wires is different from the width of each of the second quantum wires, and thus the coupling coefficient of the first quantum wires is larger than the coupling coefficient of the second quantum wires. In addition, the product of the length of a distributed Bragg reflector and the coupling coefficient contributes to the reflectivity and the bandwidth of the stop-band. Therefore, the distributed Bragg reflector formed by the first quantum wires can have a reflectivity higher than the reflectivity of the distributed Bragg reflector formed by the second quantum wires. Accordingly, the distributed Bragg reflector formed by the first quantum wires functions as a reflector having a high reflectivity. On the other hand, the bandwidth of the stop-band of the distributed Bragg reflector formed by the second quantum wires is smaller than the bandwidth of the stop-band of the distributed Bragg reflector formed by the first quantum wires. A plurality of longitudinal modes are included in the stop-band of the distributed Bragg reflector formed by the first quantum wires, and threshold gains of these longitudinal modes are decreased. Among these longitudinal modes, only the threshold gain of a longitudinal mode included also in the stop-band of the distributed Bragg reflector formed by the second quantum wires is further decreased. Only this longitudinal mode is selected and emitted as a single oscillation mode. Accordingly, the distributed Bragg reflector formed by the second quantum wires functions as a wavelength filter, and thus this semiconductor laser operates in a single longitudinal mode. The width of the quantum wires can be controlled by changing the pattern shape of the mask. Furthermore, the length of a distributed Bragg reflector constituted by a plurality of quantum wires in the direction of the predetermined axis can also be controlled by changing the pattern shape. Thus, the reflectivity and the bandwidth of the stop-band of the distributed Bragg reflector can be easily controlled.

The method of making a semiconductor laser according to the present invention may further include the steps of, after the etching of the semiconductor layer and before the growth of the buried semiconductor regions, removing the mask; and after the growth of the buried semiconductor regions, growing a second optical confinement layer. In this case, an overflow prevention layer may be simultaneously grown on the active layer in the step of growing the buried semiconductor regions, the buried semiconductor regions and the overflow prevention layer may be composed of a semiconductor material containing aluminum and indium as Group III elements and arsenic as a Group V element, the cladding region may be composed of an n-type semiconductor, the second optical confinement layer may be composed of a p-type GaInAsP semiconductor, the band-gap energy of the buried semiconductor regions and the overflow prevention layer may be larger than the band-gap energy of the second optical confinement layer and may be larger than the maximum band-gap energy of semiconductor layers in the active layer, and the second optical confinement layer may be grown on the first quantum wires, the second quantum wires, the buried semiconductor regions, and the overflow prevention layer.

In the method of the present invention, the overflow prevention layer is grown on the active layer, and the second optical confinement layer is then grown thereon. The valence band offset between the overflow prevention layer and the second optical confinement layer can be small, and thus the overflow prevention layer does not function as a substantial barrier for holes moving toward the active layer. Therefore, a semiconductor laser having satisfactory characteristics can be obtained. On the other hand, at the conduction band side, the overflow prevention layer functions as a potential barrier for electrons moving from the active layer because of a difference in the magnitude of the band-gap energy. Accordingly, overflow of carriers (electrons) from the active layer can be suppressed, and thus a semiconductor laser having satisfactory temperature characteristics can be obtained. Furthermore, the buried semiconductor regions and the overflow prevention layer are formed at the same time by a common semiconductor growth process. Therefore, the preparation process can be simplified.

The above objects, other objects, features, and advantages of the present invention will become more easily apparent from a detailed description below with reference to the attached drawings shown as exemplifications.

DESCRIPTION OF THE PREFERRED EMBODIMENTS

Figure 1:
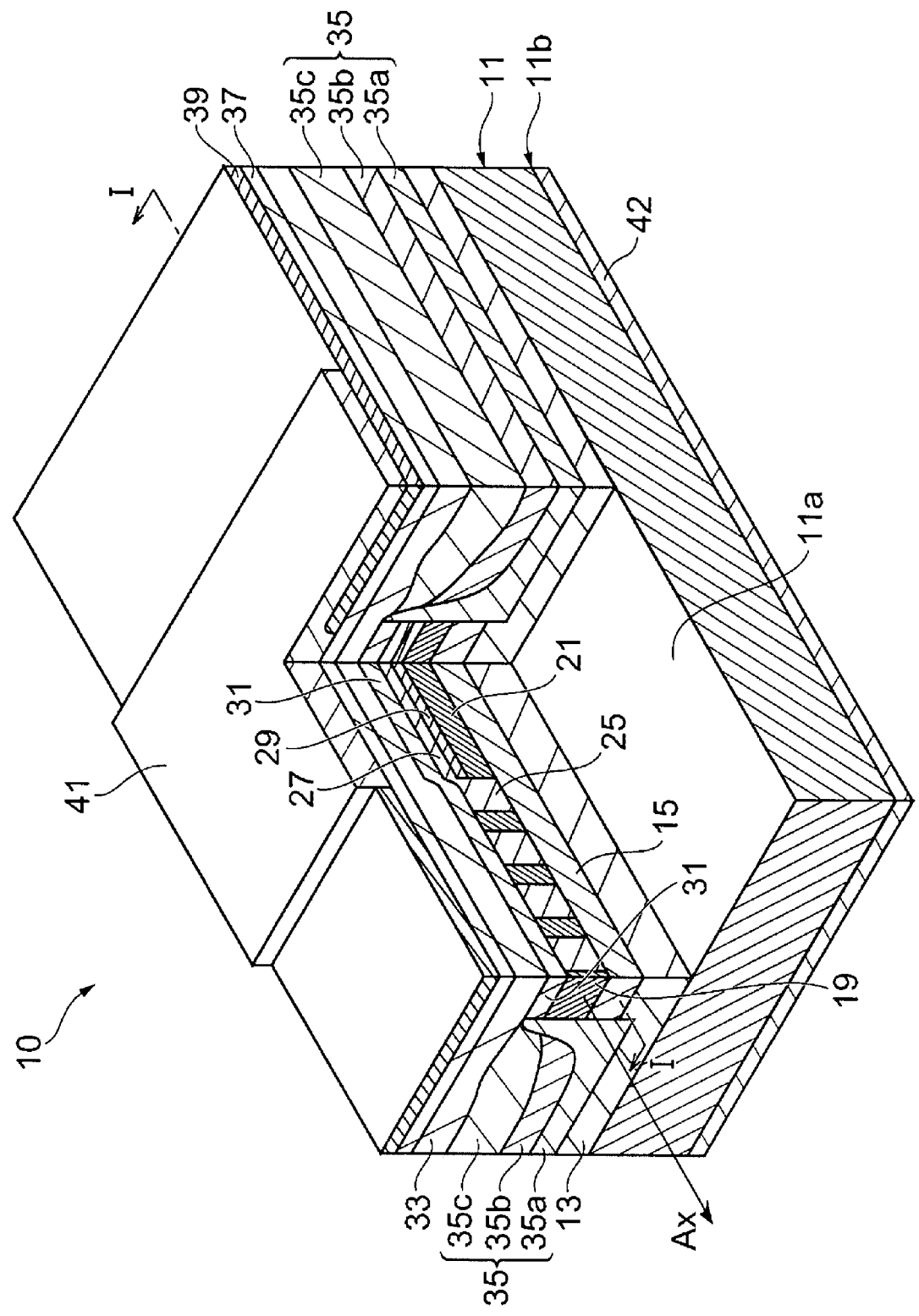
FIG. 1 is a perspective view showing the structure of a semiconductor laser according to a first embodiment of the present invention.

Findings of the present invention can be easily understood by considering the detailed description below with reference to the attached drawings shown as exemplifications. Next, semiconductor lasers and a method of making a semiconductor laser according to embodiments of the present invention will now be described with reference to the attached drawings. The same components are assigned the same reference numerals for each possible case.

Figure 2:
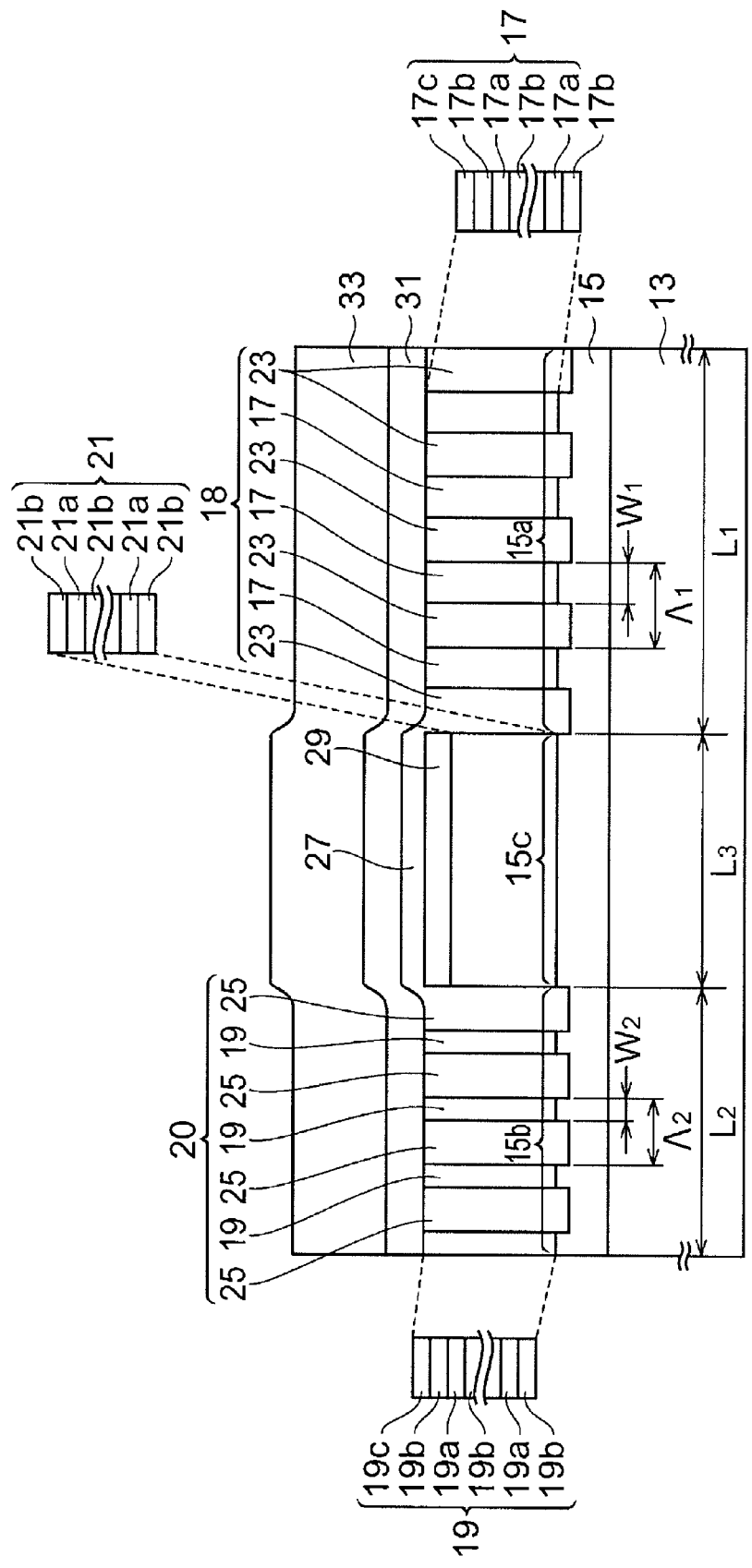
FIG. 2 is a partial, enlarged, cross-sectional view of FIG. 1.

FIG. 1 is a perspective view showing the structure of a semiconductor laser according to a first embodiment of the present invention. FIG. 2 is a cross-sectional view taken along line I-I of FIG. 1. A semiconductor laser 10 includes a first cladding layer 13, a first optical confinement layer 15, a first distributed Bragg reflector 18, a second distributed Bragg reflector 20, an active layer 21, a second optical confinement layer 31, and a second cladding layer 33. The first cladding layer 13 is provided on a main surface 11a of a semiconductor substrate 11. The semiconductor substrate 11 and the first cladding layer 13 are composed of, for example, an n-type InP.

The first optical confinement layer 15 is provided on the first cladding layer 13. The first optical confinement layer 15 is composed of, for example, an n-type GaInAsP. The thickness of the first optical confinement layer 15 is, for example, 100 nm. Preferably, the thickness of the first optical confinement layer 15 is 100 nm or more. In addition, the thickness of the first optical confinement layer 15 is 150 nm or less. The first optical confinement layer 15 has a main surface including a first area 15a, a second area 15b, and a third area 15c. The third area 15c is disposed between the first area 15a and the second area 15b. The first area 15a, the third area 15c, and the second area 15b are arranged in that order along a predetermined axis Ax. The direction shown by the predetermined axis Ax is a direction in which a laser beam is emitted.

A plurality of first quantum wires 17 are arranged along the predetermined axis Ax with a predetermined period $\Lambda_1$ on the first area 15a of the first optical confinement layer 15. Each of the first quantum wires 17 has a width $W_1$ defined in the direction of the predetermined axis Ax. Each of the first quantum wires 17 has a quantum well structure. This quantum well structure includes first well layers 17a and first barrier layers 17b that are alternately stacked. Furthermore, each of the first quantum wires 17 includes a third optical confinement layer 17c. The third optical confinement layer 17c is provided on the quantum well structure. Each of the first well layers 17a is composed of, for example, undoped GaInAsP and has a thickness of, for example, 6 nm. Each of the first barrier layers 17b is composed of, for example, undoped GaInAsP with a composition different from that of the first well layers 17a and has a thickness of, for example, 9 nm. The third optical confinement layer 17c is composed of, for example, undoped GaInAsP and has a thickness of, for example, 40 nm. Preferably, the thickness of the third optical confinement layer 17c is 30 nm or more. In addition, the thickness of the third optical confinement layer 17c is 50 nm or less.

Buried semiconductor regions 23 are provided between side faces of adjacent first quantum wires 17. The buried semiconductor regions 23 are composed of a semiconductor material containing aluminum and indium as Group III elements and arsenic as a Group V element. For example, an AlInAs semiconductor can be used as this semiconductor material.

The average refractive index of each of the first quantum wires 17 and the refractive index of each of the buried semiconductor regions 23 are different from each other. The first quantum wires 17 and the buried semiconductor regions 23 are alternately arranged on the first area 15a with a predetermined period. Accordingly, the plurality of first quantum wires 17 and the buried semiconductor regions 23 constitute the first distributed Bragg reflector 18. The first distributed Bragg reflector 18 has a length $L_1$ in the direction of the predetermined axis Ax. Herein, the term "average refractive index of a quantum wire structure" means a thickness-weighted average refractive index determined by averaging the refractive indices of the materials of layers constituting quantum wires in consideration of the thicknesses of the layers.

A plurality of second quantum wires 19 are arranged along the predetermined axis Ax with a predetermined period $\Lambda_2$ on the second area 15b of the first optical confinement layer 15. Each of the second quantum wires 19 has a width $W_2$ defined in the direction of the predetermined axis Ax. Each of the second quantum wires 19 has a quantum well structure. This quantum well structure includes second well layers 19a and second barrier layers 19b that are alternately stacked. Furthermore, each of the second quantum wires 19 includes a fourth optical confinement layer 19c. The fourth optical confinement layer 19c is provided on the quantum well structure. Each of the second well layers 19a is composed of, for example, undoped GaInAsP and has a thickness of, for example, 6 nm. Each of the second barrier layers 19b is composed of, for example, undoped GaInAsP with a composition different from that of the second well layers 19a and has a thickness of, for example, 9 nm. The fourth optical confinement layer 19c is composed of, for example, undoped GaInAsP and has a thickness of, for example, 40 nm. Preferably, the thickness of the fourth optical confinement layer 19c is 30 nm or more. In addition, the thickness of the fourth optical confinement layer 19c is 50 nm or less.

Buried semiconductor regions 25 are provided between side faces of adjacent second quantum wires 19. The buried semiconductor regions 25 are composed of a semiconductor material containing aluminum and indium as Group III elements and arsenic as a Group V element. For example, AlInAs can be used as this semiconductor material.

The average refractive index of each of the second quantum wires 19 and the refractive index of each of the buried semiconductor regions 25 are different from each other. The second quantum wires 19 and the buried semiconductor regions 25 are alternately arranged on the second area 15b with a predetermined period. Accordingly, the plurality of second quantum wires 19 and the buried semiconductor regions 25 constitute the second distributed Bragg reflector 20. The second distributed Bragg reflector 20 has a length $L_2$ in the direction of the predetermined axis Ax.

On the third area 15c of the first optical confinement layer 15, the active layer 21 is provided along the predetermined axis Ax so as to extend from an end of the third area 15c to another end thereof. This active layer 21 has a quantum well structure. This quantum well structure includes third well layers 21a and third barrier layers 21b that are alternately stacked. A fifth optical confinement layer 29 is provided on the quantum well structure. Each of the third well layers 21a is composed of, for example, undoped GaInAsP and has a thickness of, for example, 6 nm. Each of the third barrier layers 21b is composed of, for example, undoped GaInAsP with a composition different from that of the third well layers 21a and has a thickness of, for example, 9 nm. The fifth optical confinement layer 29 is composed of, for example, undoped GaInAsP and has a thickness of, for example, 40 nm. Preferably, the thickness of the fifth optical confinement layer 29 is 30 nm or more. In addition, the thickness of the fifth optical confinement layer 29 is 50 nm or less.

The first distributed Bragg reflector 18, the second distributed Bragg reflector 20, and the active layer 21 form a laser cavity. This laser cavity has a cavity length defined by a length $L_3$ of the active layer 21 in the direction of the predetermined axis Ax. Each of the period $\Lambda_1$ of the first quantum wires 17 and the period $\Lambda_2$ of the second quantum wires 19 is a period that satisfies the Bragg condition and is represented by $\Lambda = n \cdot \lambda_0/(2 \cdot n_{eq})$ wherein n represents integer, $\lambda_0$ represents the lasing wavelength and $n_{eq}$ represents the equivalent refractive index of an optical waveguide included in the first distributed Bragg reflector 18 or the second distributed Bragg reflector 20. For example, when the lasing wavelength ($\lambda_0$) is 1,550 nm and n is equal to 1 for the first order grating, each of the period $\Lambda_1$ and the period $\Lambda_2$ is 240 nm. When the lasing wavelength is 1,300 nm and n is equal to 1 for the first order grating, each of the period $\Lambda_1$ and the period $\Lambda_2$ is 200 nm.

In the first quantum wires 17 and the second quantum wires 19, the absorption edge wavelength is shorter than the bandgap wavelength (emission wavelength) of the active layer 21 because of the quantum effect. Consequently, the first distributed Bragg reflector 18 and the second distributed Bragg reflector 20 function as optical waveguides with a low loss. In this case, the width $W_1$ of each of the first quantum wires 17 and the width $W_2$ of each of the second quantum wires 19 are each preferably 50 nm or less. By controlling the width $W_1$ of each of the first quantum wires 17 and the width $W_2$ of each of the second quantum wires 19 to be 50 nm or less, the absorption edge wavelength can be shortened by an effective quantum effect. For example, when the width of each of the quantum wires is 40 nm, the absorption edge wavelength can be shifted by about 50 nm (25 meV) to the short-wavelength side. Furthermore, the width $W_1$ of each of the first quantum wires 17 and the width $W_2$ of each of the second quantum wires 19 are each preferably 20 nm or more. By controlling the width of each of the quantum wires to be 20 nm or more, the coupling coefficient ($\kappa$) of a diffraction grating can be made to be a satisfactorily large predetermined value or more. Accordingly, the first distributed Bragg reflector 18 and the second distributed Bragg reflector 20 can function as distributed Bragg reflectors each having a predetermined reflectivity. In the semiconductor laser 10 having the above structure, an optical waveguide layer composed of the same structure as the active layer can be simultaneously formed in forming the active layer, or an HR coating film composed of a dielectric film need not be formed. Therefore, a laser cavity not having a butt joint structure can be realized. In a semiconductor laser having the butt joint structure, the optical coupling loss between an active layer and an optical waveguide layer at a butt joint portion increases. However, in the above-described semiconductor laser 10, such a butt joint structure is not included in the laser cavity, and thus the optical coupling loss due to the butt joint structure can be decreased. Furthermore, in this semiconductor laser 10, a diffraction grating for achieving a single-mode operation is not formed in the active layer 21 or in the vicinity thereof. Accordingly, crystalline damage to the active layer 21 caused during the formation of the diffraction grating does not occur, and thus introduction of crystal defects due to this crystalline damage can be prevented and degradation of device characteristics can be reduced.

Figure 3A:
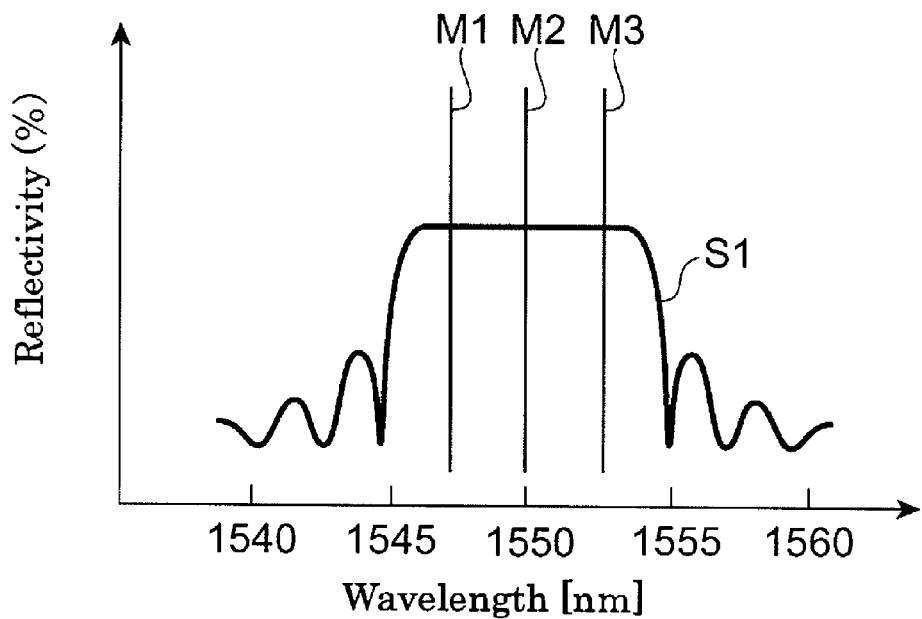
FIGS. 3A and 3B are graphs showing reflection spectra of a first distributed Bragg reflector and a second distributed Bragg reflector, respectively.
Figure 3B:
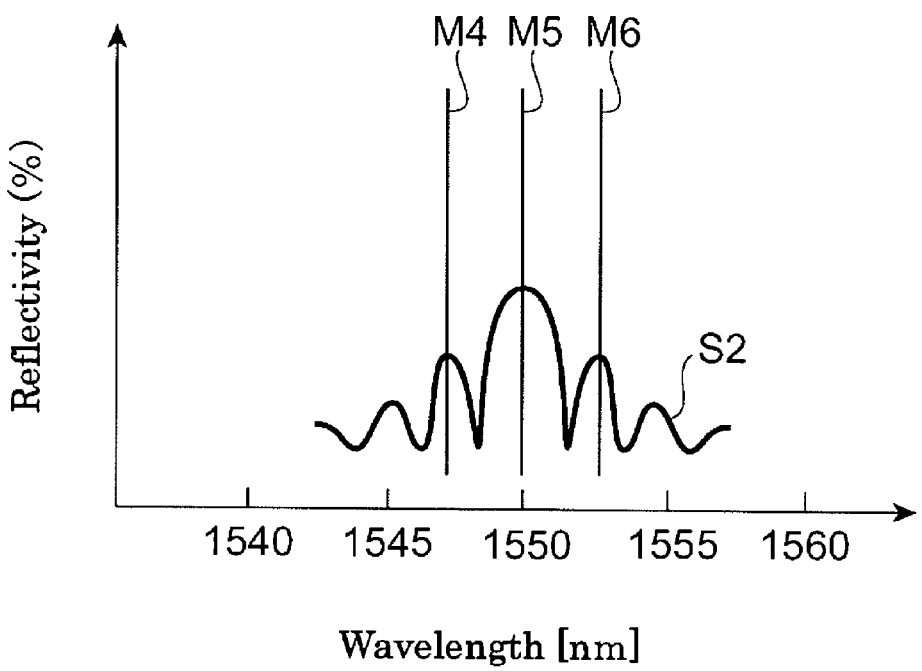

The width $W_1$ of each of the first quantum wires 17 is preferably larger than the width $W_2$ of each of the second quantum wires 19, and the length $L_1$ of the first distributed Bragg reflector 18 is preferably longer than the length $L_2$ of the second distributed Bragg reflector 20. FIGS. 3A and 3B show examples of reflection spectra of the first distributed Bragg reflector 18 and the second distributed Bragg reflector 20, respectively, in such a case. The lasing wavelength of the semiconductor laser in this example is 1,550 nm, and the period $\Lambda_1$ and the period $\Lambda_2$ are each 240 nm. Referring to FIGS. 3A and 3B, the reflectivity of a reflection spectrum S1 around a wavelength of 1,550 nm is higher than the reflectivity of a reflection spectrum S2. Furthermore, the bandwidth of the stop-band of the reflection spectrum S2 around a wavelength of 1,550 nm is smaller than the bandwidth of the stop-band of the reflection spectrum S1.

The width of a quantum wire of a distributed Bragg reflector contributes to the magnitude of the coupling coefficient ($\kappa$) of a diffraction grating. The product ($\kappa \cdot L$) of the length (L) of a distributed Bragg reflector and the coupling coefficient ($\kappa$) contributes to the reflectivity of the distributed Bragg reflector. Since the width $W_1$ is larger than the width $W_2$ and the length $L_1$ is longer than the length $L_2$, the reflectivity of the first distributed Bragg reflector 18 is larger than that of the second distributed Bragg reflector 20. Accordingly, the first distributed Bragg reflector 18 functions as a reflector having a high reflectivity. Therefore, an HR coating film composed of a dielectric film need not be provided on a back facet which is opposite to a front facet from which a laser beam is emitted.

The product ($\kappa \cdot L$) of the length (L) of a distributed Bragg reflector and the coupling coefficient ($\kappa$) also contributes to the bandwidth of the stop-band of the distributed Bragg reflector. Therefore, the bandwidth of the stop-band of the second distributed Bragg reflector 20 is smaller than that of the first distributed Bragg reflector 18. Accordingly, the second distributed Bragg reflector 20 functions as an optical filter provided with wavelength selectivity.

In order to realize the above-described high reflectivity of the first distributed Bragg reflector 18 and wavelength selectivity of the second distributed Bragg reflector 20, the width $W_1$ is, for example, 40 nm and the $W_2$ is, for example, 20 nm. The length $L_1$ is, for example, 300 μm, and the length $L_2$ is, for example, 100 μm. The length $L_1$ can be adjusted by changing the number of first quantum wires 17 arranged in the first area 15a. The length $L_2$ can be adjusted by changing the number of second quantum wires 19 arranged in the second area 15b.

Solid lines M1 to M3 in FIG. 3A and solid lines M4 to M6 in FIG. 3B show longitudinal modes generated in the laser cavity. Since the reflection spectrum S1 has a large bandwidth of the stop-band in the vicinity of a wavelength of 1,550 nm, the reflectivity to each of the longitudinal modes M1 to M3 is high. On the other hand, since the reflection spectrum S2 has a small bandwidth of the stop-band in the vicinity of a wavelength of 1,550 nm, the reflectivity to the longitudinal mode M5 is high and the reflectivity to the longitudinal mode M4 and the reflectivity to the longitudinal mode M6 are low. Therefore, the longitudinal mode M5 is selectively reflected in the second distributed Bragg reflector 20, and thus lasing at a single longitudinal mode is realized.

In order to realize a single longitudinal mode operation using the wavelength selectivity of the second distributed Bragg reflector 20, it is necessary that the interval between a plurality of longitudinal modes generated in the laser cavity be sufficiently large. Therefore, the length $L_3$ of the active layer 21 is preferably 100 μm or less. On the other hand, in order to obtain a sufficient gain, the length $L_3$ of the active layer 21 is preferably 50 μm or more.

The first well layers 17a, the second well layers 19a, and the third well layers 21a may be composed of the same material. The first barrier layers 17b, the second barrier layers 19b, and the third barrier layers 21b may be composed of the same material. In such a case, since the first quantum wires 17, the second quantum wires 19, and the active layer 21 include well layers and barrier layers composed of the same materials, these semiconductor layers can be formed by a common semiconductor growth process. Accordingly, the preparation process can be simplified.

An overflow prevention layer 27 is provided on the fifth optical confinement layer 29. This overflow prevention layer 27 is composed of a semiconductor material containing aluminum and indium as Group III elements and arsenic as a Group V element. For example, AlInAs can be used as this semiconductor material.

The second optical confinement layer 31 is provided on the first distributed Bragg reflector 18, the second distributed Bragg reflector 20, and the overflow prevention layer 27. This second optical confinement layer 31 is composed of, for example, a p-type GaInAsP or AlGaInAs. The thickness of the second optical confinement layer 31 is, for example, 60 nm. Preferably, the thickness of the second optical confinement layer 31 is 60 nm or more. In addition, the thickness of the second optical confinement layer 31 is 110 nm or less.

Figure 4:
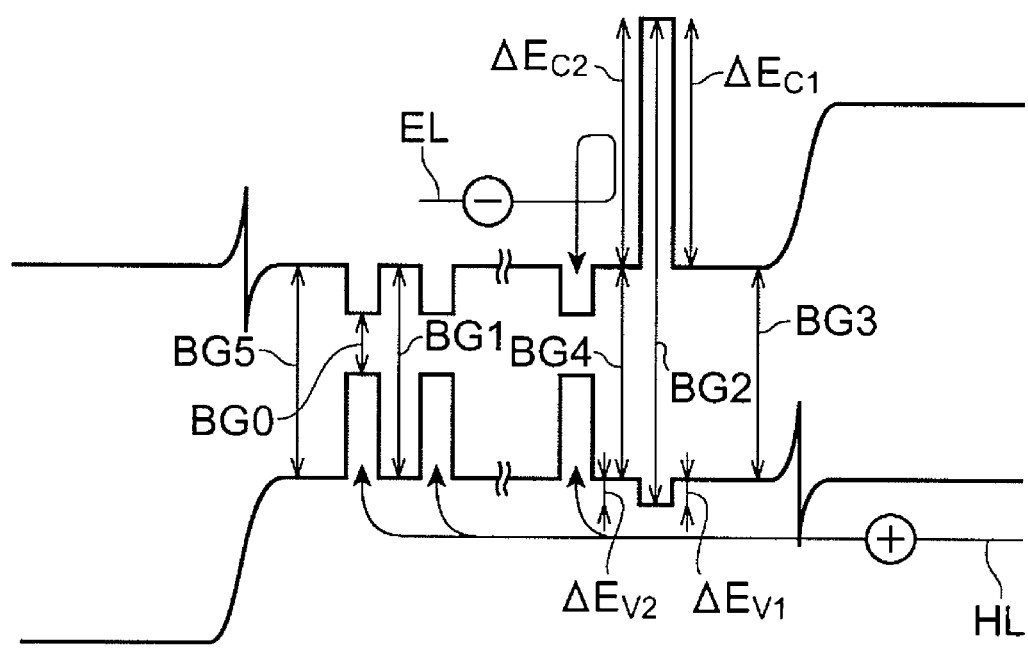
FIG. 4 is a schematic view showing an energy band diagram of a semiconductor laser.

FIG. 4 is an energy band diagram in the semiconductor laser 10 shown in FIGS. 1 and 2. In FIG. 4, reference numeral BG0 represents the band-gap energy of portions composed of the third well layer 21a, and reference numeral BG1 represents the band-gap energy of portions composed of the third barrier layer 21b. Reference numeral BG2 represents the band-gap energy of the overflow prevention layer 27. Reference numeral BG3 represents the band-gap energy of the second optical confinement layer 31. Reference numeral BG4 represents the band-gap energy of the fifth optical confinement layer 29. Reference numeral BG5 represents the band-gap energy of the first optical confinement layer 15. As shown in FIG. 4, the band-gap energy of the overflow prevention layer 27 is larger than the band-gap energy of the second optical confinement layer 31 and is larger than the maximum band-gap energy of the semiconductor layers in the active layer 21.

When the overflow prevention layer 27 is composed of AlInAs and the second optical confinement layer 31 and the fifth optical confinement layer 29 are composed of GaInAsP, a valence band offset $\Delta E v_1$ between the overflow prevention layer 27 and the second optical confinement layer 31 and a valence band offset $\Delta E v_2$ between the overflow prevention layer 27 and the fifth optical confinement layer 29 are about 10 meV, and a conduction band offset $\Delta E c_1$ between the overflow prevention layer 27 and the second optical confinement layer 31 and a conduction band offset $\Delta E c_2$ between the overflow prevention layer 27 and the fifth optical confinement layer 29 are about 200 meV. Thus, the valence band offset $\Delta E v_1$ between the overflow prevention layer 27 and the second optical confinement layer 31 and the valence band offset $\Delta E v_2$ between the overflow prevention layer 27 and the fifth optical confinement layer 29 are smaller than the conduction band offsets $\Delta E c_1$ and $\Delta E c_2$, respectively, by one order of magnitude or more. Therefore, the overflow prevention layer 27 does not readily function as a barrier for a hole HL moving from a p-type cladding layer to the active layer 21. Furthermore, the conduction band offset $\Delta E c_1$ between the overflow prevention layer 27 and the second optical confinement layer 31 and the conduction band offset $\Delta E c_2$ between the overflow prevention layer 27 and the fifth optical confinement layer 29 are larger than the valence band offsets $\Delta E v_1$ and $\Delta E v_2$, respectively, by one order of magnitude or more. Therefore, the overflow prevention layer 27 can effectively prevent an electron EL moving from the active layer 21 from overflowing to the p-type cladding layer. Accordingly, overflow of electrons from the active layer to the p-type cladding layer can be suppressed, and thus a semiconductor laser having satisfactory temperature characteristics can be obtained. In order that the overflow prevention layer 27 effectively prevents overflow of electrons, the thickness of the overflow prevention layer 27 disposed on the active layer 21 is preferably 20 nm or more. When the overflow prevention layer 27 is provided, an increase in the electric resistance due to heterobarriers between the overflow prevention layer 27 and the second optical confinement layer 31 and between the overflow prevention layer 27 and the fifth optical confinement layer 29 may occur. In order to suppress this increase in the electric resistance due to the formation of the overflow prevention layer 27, the thickness of the overflow prevention layer 27 disposed on the active layer 21 is preferably 50 nm or less.

FIGS. 1 and 2 will now be referred to again. The first cladding layer 13, the first optical confinement layer 15, the first distributed Bragg reflector 18, the second distributed Bragg reflector 20, the active layer 21, the overflow prevention layer 27, and the second optical confinement layer 31 constitute a semiconductor mesa structure extending along the predetermined axis Ax. The semiconductor mesa structure has a stripe shape, and the side faces of the semiconductor mesa structure are buried by buried regions 35.

Each of the buried regions 35 includes, for example, a first p-type current blocking layer 35a, an n-type current blocking layer 35b, and a second p-type current blocking layer 35c. The first p-type current blocking layer 35a is provided on the side faces of the semiconductor mesa structure and on the surface of the first cladding layer 13 to cover the surface of the first cladding layer 13 and the side faces of the semiconductor mesa structure. The n-type current blocking layer 35b is provided on the first p-type current blocking layer 35a. The second p-type current blocking layer 35c is provided on the n-type current blocking layer 35b. Each of the current blocking layers 35a to 35c is composed of, for example, InP. A p-n-p-n thyristor structure is formed in this lamination.

The second cladding layer 33 is provided on the semiconductor mesa structure and the buried regions 35. The second cladding layer 33 is composed of a p-type semiconductor, and, for example, a p-type InP can be used as the second cladding layer 33. A contact layer 37 is provided on the second cladding layer 33. The contact layer 37 is composed of, for example, a p-type GaInAs. An insulating film 39 is provided on the contact layer 37. The insulating film 39 has an opening on the active layer 21. A first electrode 41 is provided thereon. The first electrode 41 forms an ohmic contact with the contact layer 37 through the opening. Therefore, carriers can be injected into the active layer 21. A second electrode 42 is provided on a back surface 11b opposite to the main surface 11a of the semiconductor substrate 11. The second electrode 42 forms an ohmic contact with the semiconductor substrate 11.

An example of the materials, the dopant elements, the impurity concentrations, and the thicknesses of the layers constituting the semiconductor laser described above is as follows:
First cladding layer 13: n-type InP, impurity Si, impurity concentration $1\times10^{18}$ cm$^{-3}$, thickness 500 nm
First optical confinement layer 15: n-type GaInAsP, impurity Si, impurity concentration $5\times10^{17}$ cm$^{-3}$, thickness 150 nm
First quantum wires 17: first well layers 17a and first barrier layers 17b
    First well layers 17a: undoped GaInAsP, thickness 6 nm
    First barrier layers 17b: undoped GaInAsP, thickness 9 nm
Second quantum wires 19: second well layers 19a and second barrier layers 19b
    Second well layers 19a: undoped GaInAsP, thickness 6 nm
    Second barrier layers 19b: undoped GaInAsP, thickness 9 nm
Active layer 21: third well layers 21a and third barrier layers 21b
    Third well layers 21a: undoped GaInAsP, thickness 6 nm
    Third barrier layers 21b: undoped GaInAsP, thickness 9 nm
Third optical confinement layer 17c: undoped GaInAsP, thickness 40 nm
Fourth optical confinement layer 19c: undoped GaInAsP, thickness 40 nm
Fifth optical confinement layer 29: undoped GaInAsP, thickness 40 nm
Buried semiconductor regions 23 and 25: undoped AlInAs
Overflow prevention layer 27: undoped AlInAs, thickness 40 nm
Second optical confinement layer 31: p-type GaInAsP, impurity Zn, impurity concentration $5\times10^{17}$ cm$^{-3}$, thickness 110 nm
Second cladding layer 33: P-type InP, impurity Zn, impurity concentration $1\times10^{18}$ cm$^{-3}$, thickness 2,000 nm
Contact layer 37: p-type GaInAs, impurity Zn, impurity concentration $1\times10^{19}$ cm$^{-3}$, thickness 500 nm Next, a method of making the semiconductor laser according to the first embodiment will be described with reference to FIG. 5A to FIG. 8B.

Figure 5A:
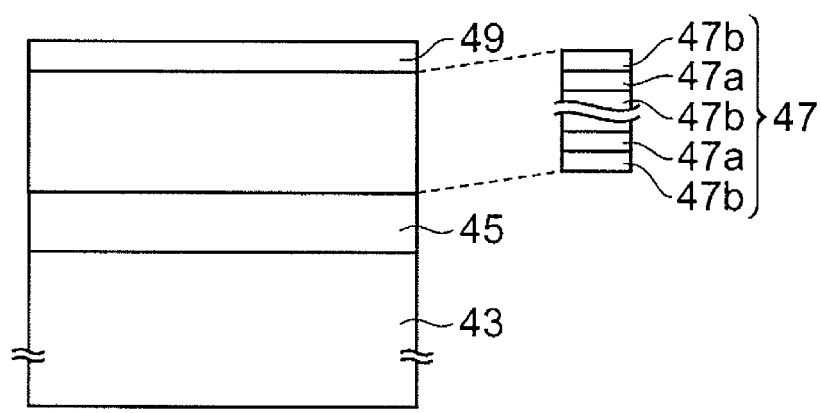
FIG. 5A is a cross-sectional view showing steps in a method of making a semiconductor laser and FIG. 5B is a cross-sectional view showing steps in a method of making a semiconductor laser in succession to FIG. 5A.

As shown in FIG. 5A, a first cladding layer 43 composed of an n-type InP and a first optical confinement layer 45 composed of an n-type GaInAsP are sequentially grown on a substrate composed of an n-type InP. Subsequently, a plurality of semiconductor layers composed of undoped GaInAsP are grown on the first optical confinement layer 45 to form a multi-quantum well layer 47. The multi-quantum well layer 47 includes well layers 47a and barrier layers 47b with a composition different from that of the well layers 47a. An optical confinement semiconductor layer 49 composed of undoped GaInAsP is grown on the multi-quantum well layer 47. These layers are grown by, for example, metal-organic vapor phase epitaxy (MOVPE) method.

Figure 5B:
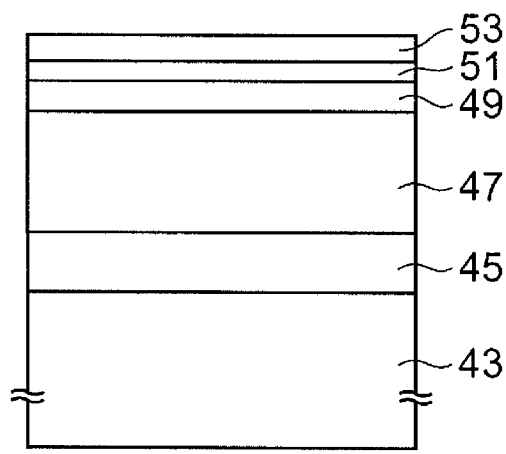

As shown in FIG. 5B, an insulating film 51 is formed on the optical confinement semiconductor layer 49. The insulating film 51 is formed by, for example, a plasma chemical vapor deposition (CVD) method using a silane-based gas and an oxygen-based gas as process gases. As an example of the silane-based gas, a monosilane is used. As an example of the oxygen-based gas, oxygen gas is used. The insulating film 51 is composed of, for example, a silicon oxide such as $SiO_2$. In order to ensure an etching selection ratio of the insulating film 51 to a resist film 53, the thickness of the insulating film 51 is preferably about 15 nm or more and 20 nm or less. Subsequently, the resist film 53 is formed on the insulating film 51. A resist for electron beam exposure is used as the resist film 53.

Figure 6A:
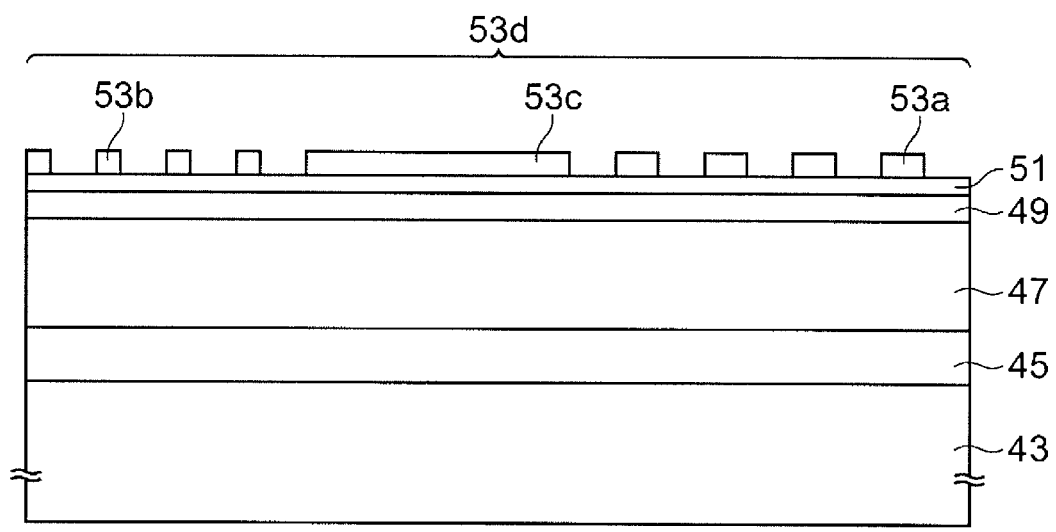
FIG. 6A is a cross-sectional view showing steps in the method of making a semiconductor laser in succession to FIG. 5B

As shown in FIG. 6A, a resist mask 53d is formed on the insulating film 51. The resist mask 53d is formed by exposing the resist film 53 by an electron beam exposure method, and then developing the resist film 53. The resist mask 53d includes patterns 53a and 53b for forming, on the insulating film 51, patterns for a plurality of quantum wires that are periodically arranged, and a pattern 53c for forming an active layer region.

Figure 6B:
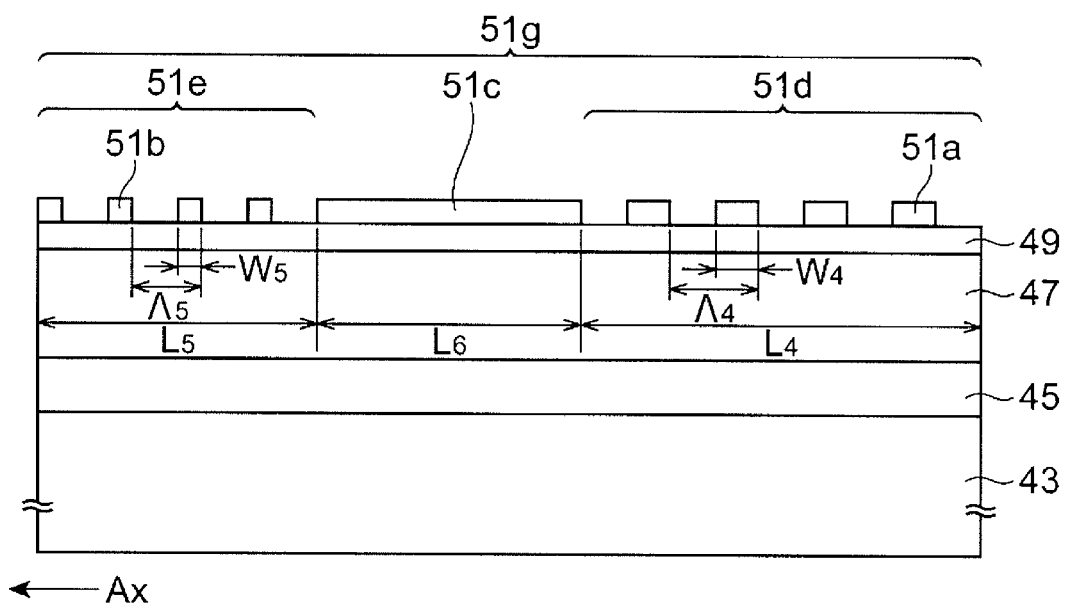
FIG. 6B is a cross-sectional view showing steps in the method of making a semiconductor laser in succession to FIG. 6A.

As shown in FIG. 6B, the insulating film 51 is etched using the resist mask 53d to form an insulating mask 51g on the optical confinement semiconductor layer 49. For this etching, for example, reactive ion etching (RIE) using carbon tetrafluoride ($CF_4$) gas can be employed. The patterns of the resist mask 53d are transferred to the insulating mask 51g by this RIE. After the etching, the resist mask 53d is removed to form the insulating mask 51g. The resist mask 53d is removed by, for example, $O_2$ plasma ashing.

The insulating mask 51g formed in this step includes a first pattern 51d for forming a plurality of first quantum wires 48a, a second pattern 51e for forming a plurality of second quantum wires 48b, and a third pattern 51c for forming an active layer region. The first pattern 51d, the second pattern 51e, and the third pattern 51c have a length $L_4$, a length $L_5$, and a length $L_6$, respectively, in the direction of a predetermined axis Ax. The first pattern 51d includes a plurality of first wire pattern elements 51a. The first wire pattern elements 51a are arranged with a predetermined period $\Lambda_4$ in the direction of the predetermined axis Ax. The second pattern 51e includes a plurality of second wire pattern elements 51b. The second wire pattern elements 51b are arranged with a predetermined period $\Lambda_5$ in the direction of the predetermined axis Ax. The third pattern 51c extends in the direction of the predetermined axis Ax.

Each of the period $\Lambda_4$ and the period $\Lambda_5$ is a period that satisfies the Bragg condition and is represented by $\Lambda = n \cdot \lambda_0 / (2 \cdot n_{eq})$ wherein n represents integer, $\lambda_0$ represents the lasing wavelength and $n_{eq}$ represents the equivalent refractive index of an optical waveguide including quantum wires. For example, when the lasing wavelength is 1,550 nm and n is equal to 1 for the first order grating, each of the period $\Lambda_4$ and the period $\Lambda_5$ is 240 nm. For example, when the lasing wavelength is 1,300 nm and n is equal to 1 for the first order grating, each of the period $\Lambda_4$ and the period $\Lambda_5$ is 200 nm.

Each of the first wire pattern elements 51a has a width $W_4$ in the direction of the predetermined axis Ax. Each of the second wire pattern elements 51b has a width $W_5$ in the direction of the predetermined axis Ax. The width $W_4$ of each of the first wire pattern elements 51a is larger than the width $W_5$ of each of the second wire pattern elements 51b. In addition, the length $L_4$ of the first pattern 51d is longer than the length $L_5$ of the second pattern 51e.

Figure 7A:
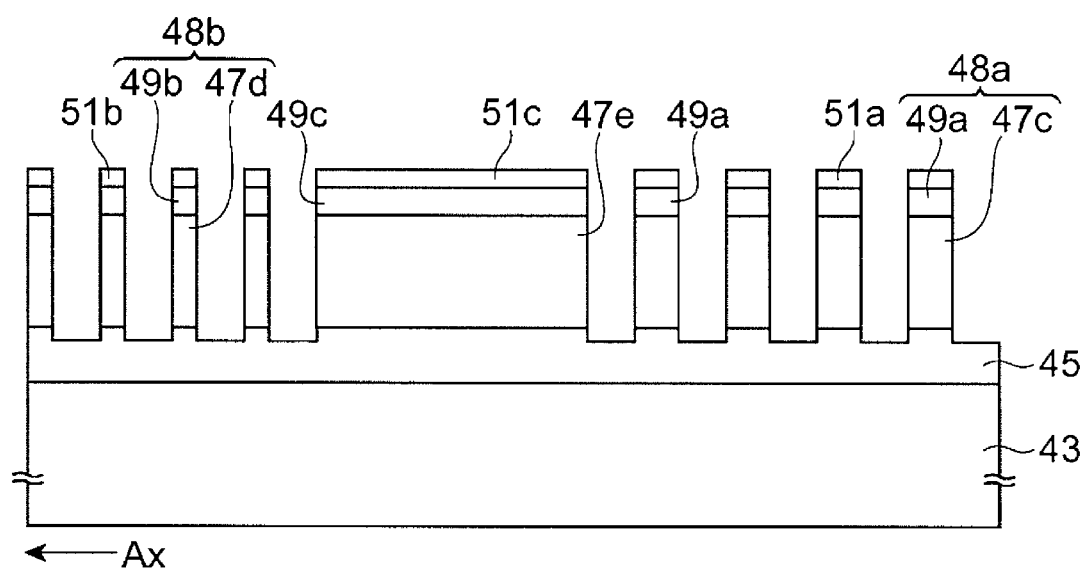
FIG. 7A is a cross-sectional view showing steps in the method of making a semiconductor laser in succession to FIG. 6B

As shown in FIG. 7A, the multi-quantum well layer 47 and the optical confinement semiconductor layer 49 are etched using the insulating mask 51g to form a plurality of first quantum wires 48a, a plurality of second quantum wires 48b, and an active layer 47e. For example, RIE using a $CH_4/H_2$ gas mixture is employed in this etching. Preferably, in this step of etching the multi-quantum well layer 47 and the optical confinement semiconductor layer 49, for example, RIE using a $CH_4/H_2$ gas mixture and $O_2$ plasma ashing for removing a carbon polymer deposited on the surface of the semiconductor during this etching are repeatedly performed. By repeating in such a manner, an arrangement of quantum wires having a good perpendicularity can be obtained.

Figure 7B:
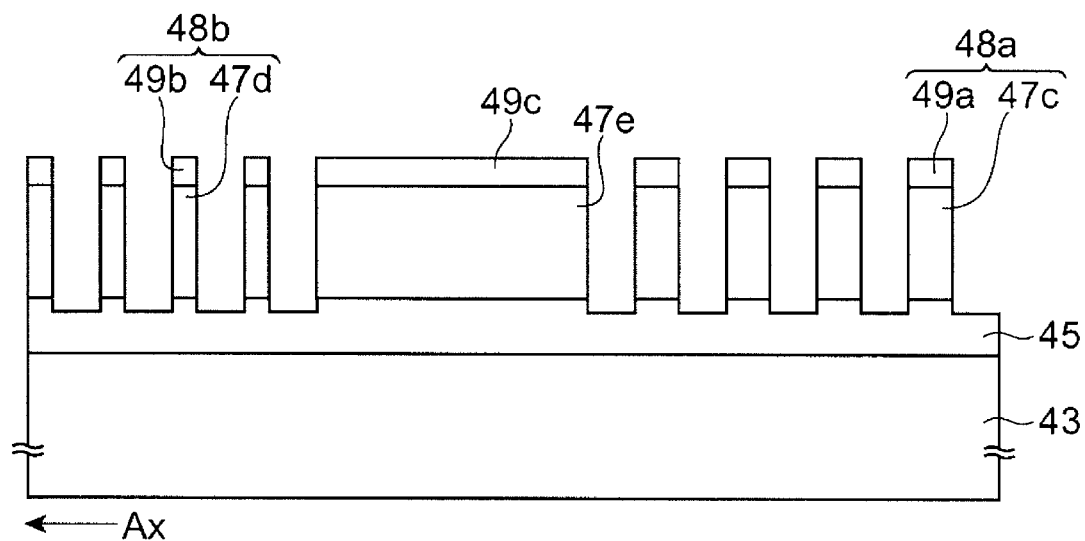
FIG. 7B is a cross-sectional view showing steps in the method of making a semiconductor laser in succession to FIG. 7A.

As shown in FIG. 7B, in order to remove a damaged layer formed by the dry etching, a wet etching is performed after the dry etching is finished. For example, a sulfuric acid-based solution is used for this wet etching. After the wet etching, the insulating mask 51g is removed. For example, the mask composed of a silicon oxide is removed by etching with buffered hydrofluoric acid.

As described with reference to FIGS. 7A and 7B, the plurality of first quantum wires 48a, the plurality of second quantum wires 48b, and the active layer 47e are formed at the same time without separately performing preparation processes. Accordingly, the preparation process can be simplified.

Figure 8A:
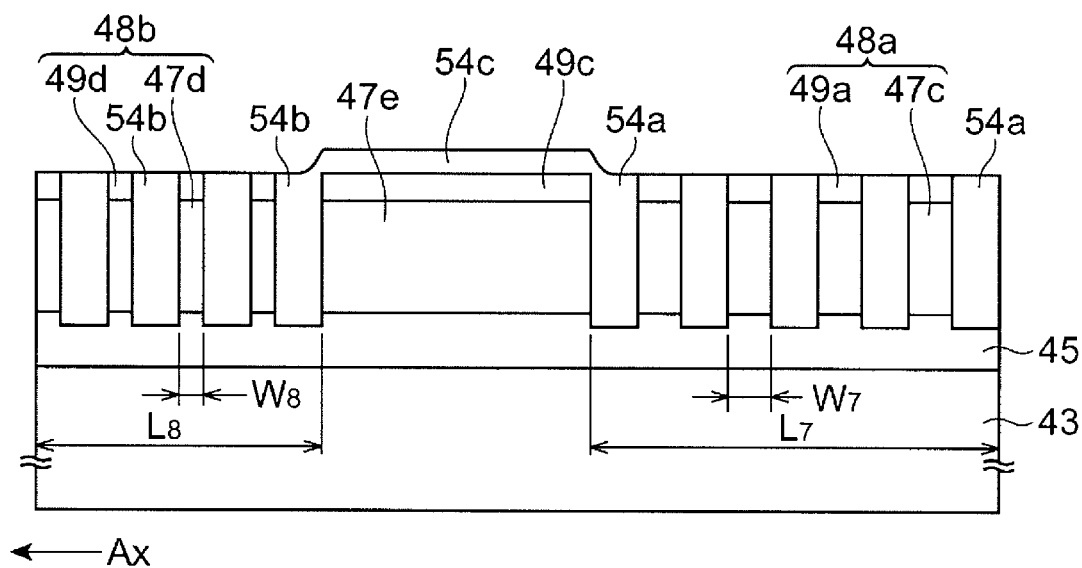
FIG. 8A is a cross-sectional view showing steps in the method of making a semiconductor laser in succession to FIG. 7B

As shown in FIG. 8A, buried semiconductor regions 54a are grown between side faces of adjacent first quantum wires 48a, and buried semiconductor regions 54b are grown between side faces of adjacent second quantum wires 48b, thus burying the first quantum wires 48a and the second quantum wires 48b. In this step, an overflow prevention layer 54c is also grown on a fifth optical confinement layer 49c. The buried semiconductor regions 54a and 54b and the overflow prevention layer 54c are composed of the same semiconductor material containing aluminum and indium as Group III elements and arsenic as a Group V element. For example, undoped AlInAs can be used as this semiconductor material. Note that the growth rate of the buried semiconductor regions 54a and 54b and the overflow prevention layer 54c is preferably low; 500 nm/h or less. At such a growth rate, the first quantum wires 48a and the second quantum wires 48b can be buried in the buried semiconductor regions 54a and 54b, respectively, in such a manner that the resulting surface is planarized.

The plurality of first quantum wires 48a and the buried semiconductor regions 54a constitute a distributed Bragg reflector, and the plurality of second quantum wires 48b and the buried semiconductor regions 54b constitute a distributed Bragg reflector. The width $W_7$ of each of the first quantum wires 48a is larger than the width $W_8$ of each of the second quantum wires 48b. Furthermore, a length $L_7$ of the arrangement of the first quantum wires 48a in the direction of the predetermined axis Ax is longer a length $L_8$ of the arrangement of the second quantum wires 48b in the direction of the predetermined axis Ax. Each of the length $L_7$ and the length $L_8$ corresponds to the length of the distributed Bragg reflector in the direction of the predetermined axis Ax. When the width of a quantum wire is large, the coupling coefficient of a diffraction grating is also large. Accordingly, the coupling coefficient of a diffraction grating including the first quantum wires 48a is larger than the coupling coefficient of a diffraction grating including the second quantum wires 48b. Furthermore, when the product of the length of a distributed Bragg reflector and the coupling coefficient is large, the reflectivity of the distributed Bragg reflector is large and the bandwidth of the stop-band is also large. Accordingly, the distributed Bragg reflector formed by the first quantum wires 48a can have a reflectivity larger than the reflectivity of the distributed Bragg reflector formed by the second quantum wires 48b. On the other hand, the bandwidth of the stop-band of the distributed Bragg reflector formed by the second quantum wires 48b is smaller than the bandwidth of the stop-band of the distributed Bragg reflector formed by the first quantum wires 48a. Therefore, the distributed Bragg reflector formed by the second quantum wires 48b functions as a wavelength filter for selecting the wavelength, and thus light emitted from this semiconductor laser is in a single longitudinal mode.

The widths of the quantum wires and the lengths of the arrangement of the quantum wires can be controlled by changing the pattern shape and the dimensions of the insulating mask 51g. Accordingly, the reflectivity and the bandwidth of the stop-band of each of the distributed Bragg reflectors can be easily controlled.

Figure 8B:
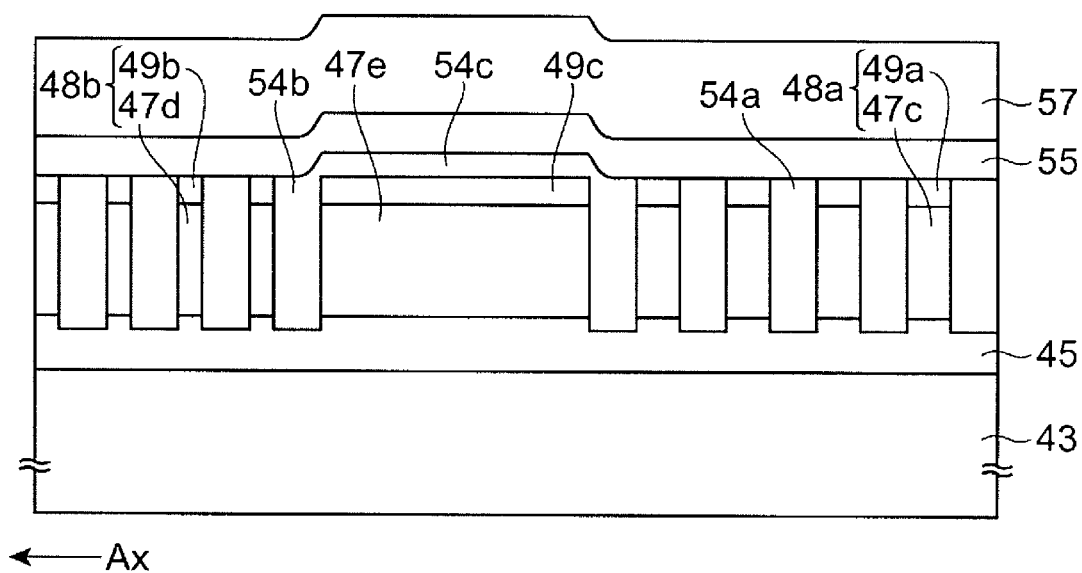
FIG. 8B is a cross-sectional view showing steps in the method of making a semiconductor laser in succession to FIG. 8A.

As shown in FIG. 8B, a second optical confinement layer 55 composed of a p-type GaInAsP semiconductor is grown on the plurality of first quantum wires 48a, the plurality of second quantum wires 48b, the buried semiconductor regions 54a and 54b, and the overflow prevention layer 54c. Subsequently, a second cladding layer 57 composed of a p-type InP semiconductor is grown on the second optical confinement layer 55.

In this case, the band gap energy of the buried semiconductor regions 54a and 54b and overflow prevention layer 54c are larger than the band gap energy of the second optical confinement layer 55 and is larger than the maximum band gap energy of semiconductor layers in the active layer 47e. Therefore, the overflow prevention layer 54c functions as a potential barrier for electrons moving from the active layer 47e. Accordingly, electrons moving from the active layer 47e do not reach the second optical confinement layer 55. On the other hand, the overflow prevention layer 54c does not function as a barrier for holes moving from the p-type cladding layer to the active layer 47e. Accordingly, these holes pass through the overflow prevention layer 54c and reach the active layer 47e.

Subsequently, a contact layer is grown on the second cladding layer 57. Furthermore, in order to obtain a single transverse mode, a buried hetero-structure (BH) having a stripe width of about 1 μm, i.e., a refractive-index waveguide structure is formed.

Figure 9:
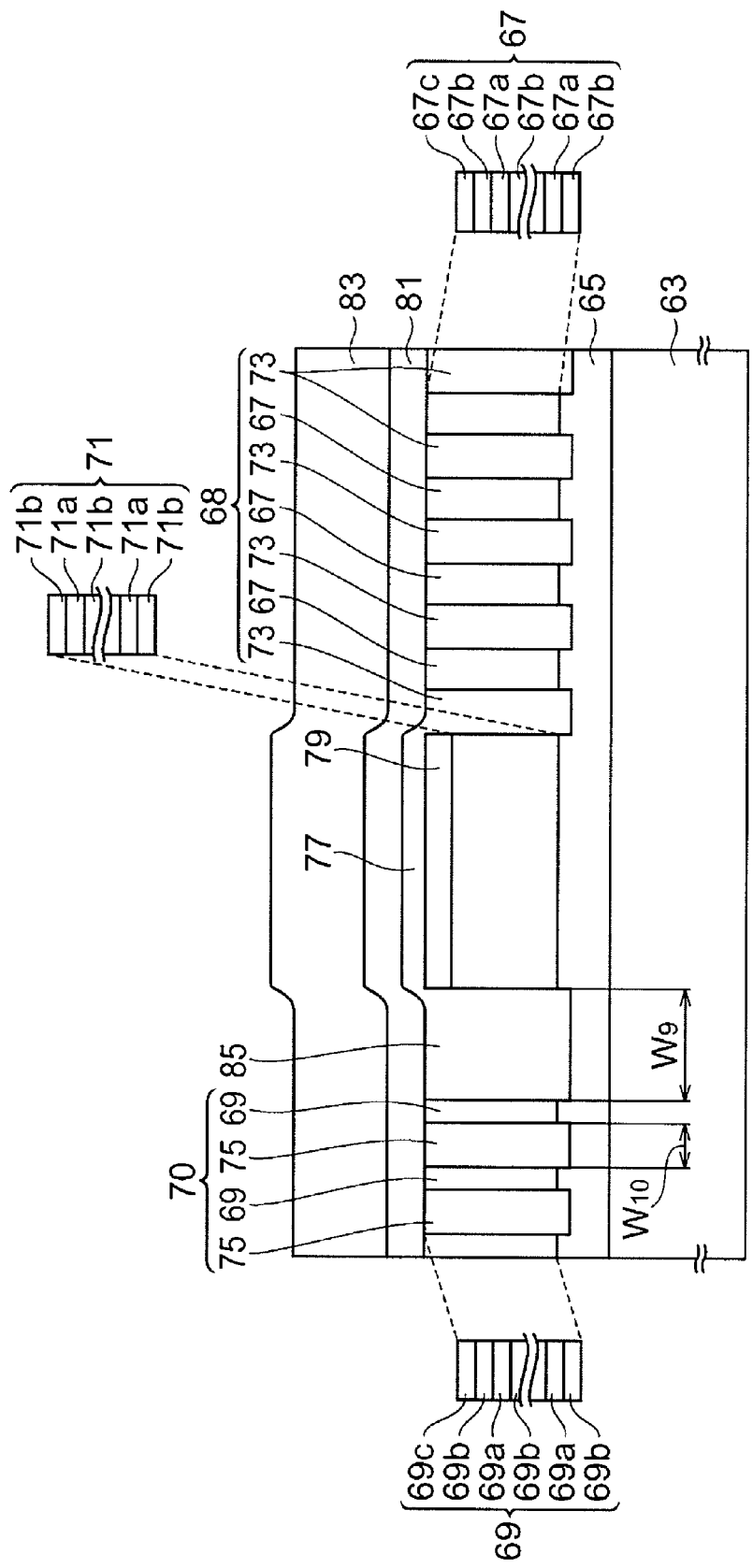
FIG. 9 is a cross-sectional view that schematically shows the structure of a semiconductor laser according to a second embodiment of the present invention.

FIG. 9 is a cross-sectional view showing the structure of a semiconductor laser according to a second embodiment of the present invention. The structure of the semiconductor laser shown in FIG. 9 differs from the structure of the semiconductor laser of the first embodiment in that a gap region 85 is provided between an active layer 71 and a second distributed Bragg reflector 70. This difference will be described.

The gap region 85 is composed of the same material as buried semiconductor regions 75. In addition, a width $W_9$ of the gap region 85 in the direction of a predetermined axis Ax is larger than a width $W_{10}$ of each of the buried semiconductor regions 75 in the direction of the predetermined axis Ax. By providing this gap region 85, scattering loss generated between the active layer 71 and the second distributed Bragg reflector 70 can be decreased to improve the coupling efficiency between the active layer 71 and the second distributed Bragg reflector 70. Accordingly, a high output of a laser beam can be realized. For example, as the material of this gap region 85, undoped AlInAs can be used. The width $W_9$ of the gap region 85 is, for example, about 500 nm. The width $W_9$ of the gap region 85 is preferably 300 nm or more in order to avoid the effect of the scattering loss. Furthermore, the width $W_9$ of the gap region 85 is preferably 1,000 nm or less so that internal optical loss including optical absorption does not increase.

The principle of the present invention has been described in the preferred embodiments with reference to the drawings. It is to be understood by those skilled in the art that the present invention can be changed in the arrangement and in the details without departing from the principle. The present invention is not limited to the specific structures disclosed in the above embodiments. In the above embodiments, semiconductor lasers have been illustratively described, but the embodiments can be applied to a semiconductor optical modulator, an integrated device including such a semiconductor optical modulator and a semiconductor laser, and the like. Accordingly, all modifications and changes derived from the scope of the claims and the scope of the spirit thereof are claimed.

What is claimed is:

1. A semiconductor laser comprising:
    a first optical confinement layer that is disposed on a cladding region and that has a main surface including a first area, a second area, and a third area;
    a plurality of first quantum wires arranged on the first area along a predetermined axis;
    a plurality of second quantum wires arranged on the second area along the predetermined axis;
    buried semiconductor regions disposed between side faces of the first quantum wires and between side faces of the second quantum wires;
    an active layer disposed on the third area and extending from an end of the third area to another end of the third area along the predetermined axis;
    a first distributed Bragg reflector disposed on the first area and including the plurality of first quantum wires and the buried semiconductor regions disposed between the side faces of the first quantum wires;
    a second distributed Bragg reflector disposed on the second area and including the plurality of second quantum wires and the buried semiconductor regions disposed between the side faces of the second quantum wires; and
    a second optical confinement layer disposed on the first distributed Bragg reflector, the second distributed Bragg reflector, and the active layer, wherein
    the first area, the second area, and the third area are arranged along the predetermined axis,
    the third area is disposed between the first area and the second area,
    the buried semiconductor regions have a refractive index different from an average refractive index of the first quantum wires and an average refractive index of the second quantum wires,
    each of the first quantum wires includes first well layers and first barrier layers that are alternately stacked,
    each of the second quantum wires includes second well layers and second barrier layers that are alternately stacked,
    the active layer includes third well layers and third barrier layers that are alternately stacked,
    the first well layers, the second well layers, and the third well layers are composed of the same material, and
    the first barrier layers, the second barrier layers, and the third barrier layers are composed of the same material.

2. The semiconductor laser according to claim 1, wherein the reflectivity of the first distributed Bragg reflector is higher than the reflectivity of the second distributed Bragg reflector, and
    a reflection bandwidth of the first distributed Bragg reflector is larger than a reflection bandwidth of the second distributed Bragg reflector.

3. The semiconductor laser according to claim 1,
    wherein a width of each of the first quantum wires in the direction of the predetermined axis is larger than a width of each of the second quantum wires in the direction of the predetermined axis, and
    a length of the first distributed Bragg reflector in the direction of the predetermined axis is longer than a length of the second distributed Bragg reflector in the direction of the predetermined axis.

4. The semiconductor laser according to claim 1, wherein the width of each of the first quantum wires in the direction of the predetermined axis and the width of each of the second quantum wires in the direction of the predetermined axis are each 50 nm or less and 20 nm or more.

5. The semiconductor laser according to claim 1, wherein a length of the active layer in the direction of the predetermined axis is 50 μm or more and 100 μm or less.

6. The semiconductor laser according to claim 1, further comprising:
    an overflow prevention layer disposed between the active layer and the second optical confinement layer,
    wherein the cladding region is composed of an n-type semiconductor,
    the overflow prevention layer is composed of a semiconductor material containing aluminum and indium as Group III elements and arsenic as a Group V element,
    the second optical confinement layer is composed of a p-type GaInAsP semiconductor, and
    the band-gap energy of the overflow prevention layer is larger than the band-gap energy of the second optical confinement layer and is larger than the maximum band-gap energy of semiconductor layers in the active layer.

7. The semiconductor laser according to claim 1, further comprising:
    a gap region disposed between the active layer and the second distributed Bragg reflector and composed of the same material as the buried semiconductor regions,
    wherein a width of the gap region in the direction of the predetermined axis is larger than an interval between the second quantum wires.

8. The semiconductor laser according to claim 1, further comprising:
    an electrode disposed on the active layer.

9. A semiconductor laser comprising:
    a first optical confinement layer that is disposed on a cladding region and that has a main surface including a first area, a second area, and a third area;
    a plurality of first quantum wires arranged on the first area along a predetermined axis;
    a plurality of second quantum wires arranged on the second area along the predetermined axis;
    buried semiconductor regions disposed between side faces of the first quantum wires and between side faces of the second quantum wires;
    an active layer disposed on the third area and extending from an end of the third area to another end of the third area along the predetermined axis;
    a first distributed Bragg reflector disposed on the first area and including the plurality of first quantum wires and the buried semiconductor regions disposed between the side faces of the first quantum wires;
    a second distributed Bragg reflector disposed on the second area and including the plurality of second quantum wires and the buried semiconductor regions disposed between the side faces of the second quantum wires; and a second optical confinement layer disposed on the first distributed Bragg reflector, the second distributed Bragg reflector, and the active layer, wherein the first area, the second area, and the third area are arranged along the predetermined axis, the third area is disposed between the first area and the second area, the buried semiconductor regions have a refractive index different from an average refractive index of the first quantum wires and an average refractive index of the second quantum wires, a width of each of the first quantum wires in the direction of the predetermined axis is larger than a width of each of the second quantum wires in the direction of the predetermined axis, and a length of the first distributed Bragg reflector in the direction of the predetermined axis is longer than a length of the second distributed Bragg reflector in the direction of the predetermined axis.

* * * * *